United States Patent [19]

Matsuoka et al.

[11] Patent Number: 4,556,989
[45] Date of Patent: Dec. 3, 1985

[54] RADIO SYSTEM

[75] Inventors: Hironao Matsuoka, Mitaka; Kazuo Suzuka, Sayama, both of Japan

[73] Assignee: Hitachi Denshi Kabushiki Kaisha, Tokyo, Japan

[21] Appl. No.: 547,710

[22] Filed: Nov. 1, 1983

[30] Foreign Application Priority Data

Nov. 5, 1982 [JP]  Japan .......................... 57-167559[U]

[51] Int. Cl.⁴ .............................................. H04B 1/16
[52] U.S. Cl. .................................... 455/183; 365/239; 455/185
[58] Field of Search .............. 455/185, 186, 182, 183, 455/165, 76; 365/220, 239

[56] References Cited

FOREIGN PATENT DOCUMENTS 0025102  2/1979  Japan .................................. 455/185
0063120  5/1980  Japan .................................. 455/183

Primary Examiner—Marc E. Bookbinder
Attorney, Agent, or Firm—Townsend and Townsend

[57] ABSTRACT

In a radio system wherein a read signal generator generates a read signal constituted by a plurality of bits, the read signal is supplied to a memory circuit for storage of data to read out the data, and the read out data determines the frequency generated by a synthesizer, the memory circuit and a holding circuit are packaged on an independent substrate, and the read signal generator comprises a first read signal generator generating about half the bits which is held in the holding circuit and a second read signal generator generating the remaining bits.

3 Claims, 6 Drawing Figures

RADIO SYSTEM

BACKGROUND OF THE INVENTION

This invention relates to a radio system utilizing a synthesizer, the frequency thereof being controlled by data read out of an EPROM.

With recent development of communication systems of various types, a radio system has been desired which is capable of switching a number of frequencies.

FIG. 1 is a block diagram showing one example of a prior art radio system. When an operating frequency to be used is set by a channel switch 1, a read signal generator controlled thereby produces a read signal constituted by a plurality of bits which is supplied to an EPROM 4 acting as a memory circuit. The EPROM 4 is previously written with data so that when a read signal is applied, the written data are read out and supplied to a synthesizer 5. The synthesizer 5 generates a signal having a frequency corresponding to the data supplied from EPROM 4 and the signal determines the operating frequency of a transmitter 6 and a receiver 7. There are also provided a connector 8, an antenna 9 and a loudspeaker 10.

With such a prior art system, however, the read signal generator 2 is required to simultaneously generate a plurality of bits constituting a read signal and accordingly, the number of signal lines that interconnect read signal generator 2 and EPROM 4 increases so that when it is desired to control the frequency by using an EPROM 4 formed on an independent substrate, the number of pins of the connector 8 increases, thus increasing its manufacturing cost and decreasing reliability.

SUMMARY OF THE INVENTION

Accordingly, it is an object of this invention to provide an improved radio system capable of reducing the number of signal lines extending from the read signal generator, thereby improving the reliability of the plug-in type connector connected between the EPROM and the read signal generator and facilitating packaging of the EPROM on an independent substrate.

According to this invention, there is provided a radio system of the type comprising read signal generating means for generating a read signal constituted by a plurality of bits, a memory circuit for storage of data, means for supplying the read signal to the memory circuit for reading out the data, and a synthesizer for producing a frequency determined by the read out data, characterized in that there are provided a holding circuit packaged on a substrate together with the memory circuit, the substrate being independent of other substrates carrying other circuit elements, and read signal generating means for sending out preceding part of the bits constituting the read signal and then sending out succeeding part of the bits, the holding circuit holding the preceding bits.

DESCRIPTION OF THE PREFERRED EMBODIMENT

Figure 1:
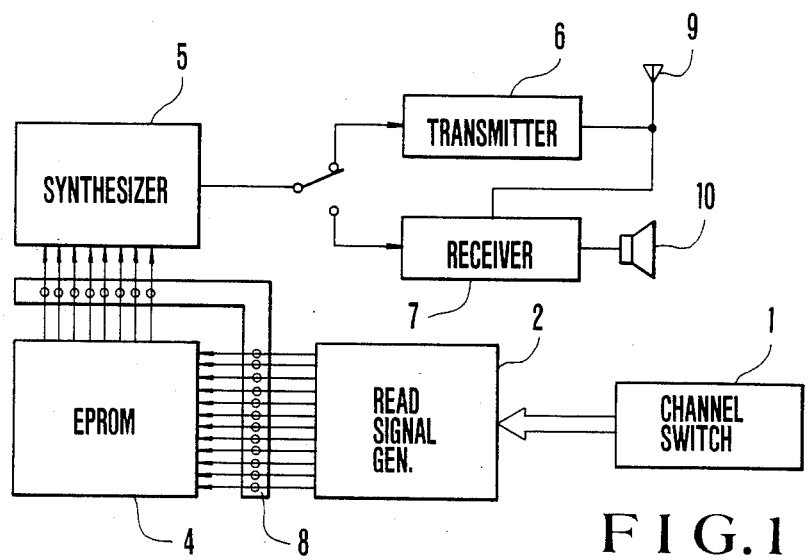
FIG. 1 is a block diagram showing one example of a prior art radio system.
Figure 2:
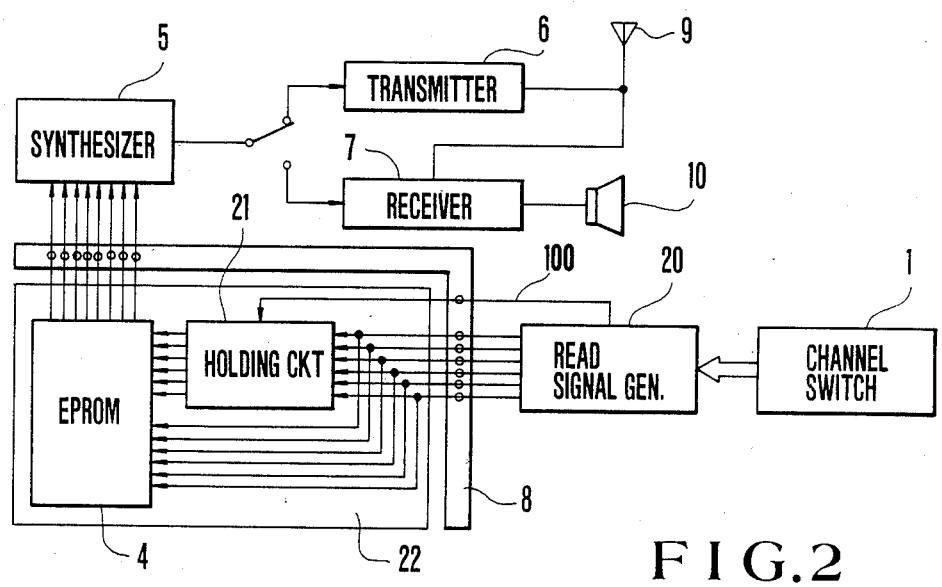
FIG. 2 is a block diagram showing one embodiment of a radio system according to this invention.

In a preferred embodiment shown in FIG. 2, circuit elements corresponding to those shown in FIG. 1 are designated by the same reference numerals. A read signal generator 20 sends out in the following manner a read signal constituted by a plurality of bits corresponding to a frequency determined by the channel switch 1. Thus, the read signal is sent out in two parts. The first or preceding part comprises about half the bits constituting the read signal and the second part comprises the remaining bits. A holding circuit 21 is provided which holds data supplied thereto when a latch write signal is supplied from the read signal generator 20 through a line 100.

The EPROM 4 and holding circuit 21 are packaged on a common substrate 22 which is independent from other substrates carrying other circuit elements.

The radio system shown in FIG. 2 operates as follows. Thus, when the channel switch 1 selects the operating frequency, the read signal generator 20 controlled by the channel switch 1 outputs a read signal. This read signal is constituted by a plurality of bits, and preceding part of the bits, for example, half the bits are sent out for the first time. The sent out signal is held by the holding circuit 21, and the signal thus held is supplied to EPROM 4. After sending out the first or preceding part of the signal, the read signal generator 20 sends the second or succeeding part, that is, the remaining half of the bits to the EPROM 4. Consequently, the EPROM 4 is supplied with a read signal constituted by the signal supplied from the holding circuit 21 and the signal supplied directly from the read signal generator 20. Consequently, data corresponding to the read signal is read out of the EPROM 4 and supplied to the synthesizer 5 which in turn produces a frequency selected by the channel switch 1.

Figure 3:
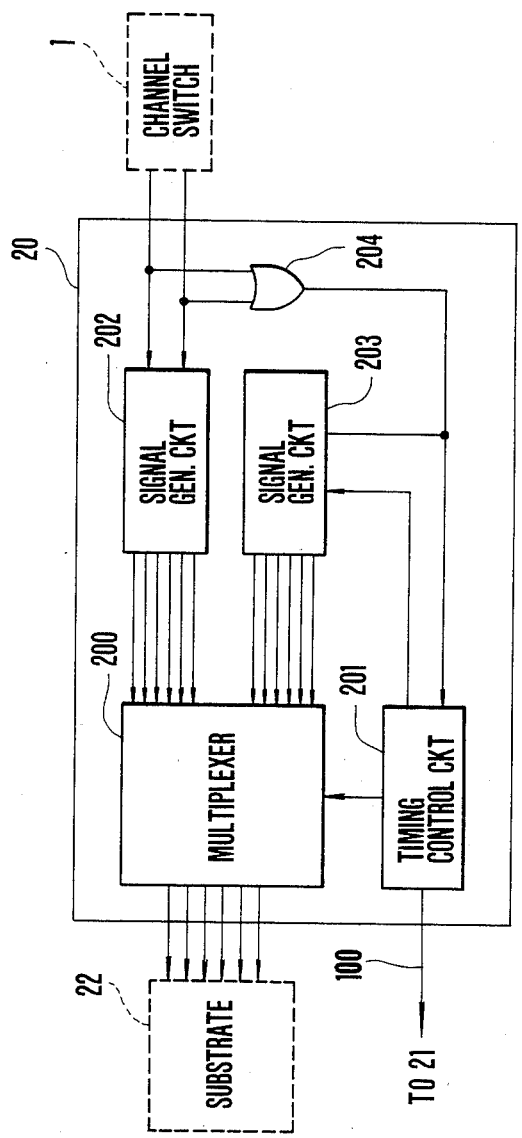
FIG. 3 is a block diagram showing one example of a read signal generator.
Figure 4:
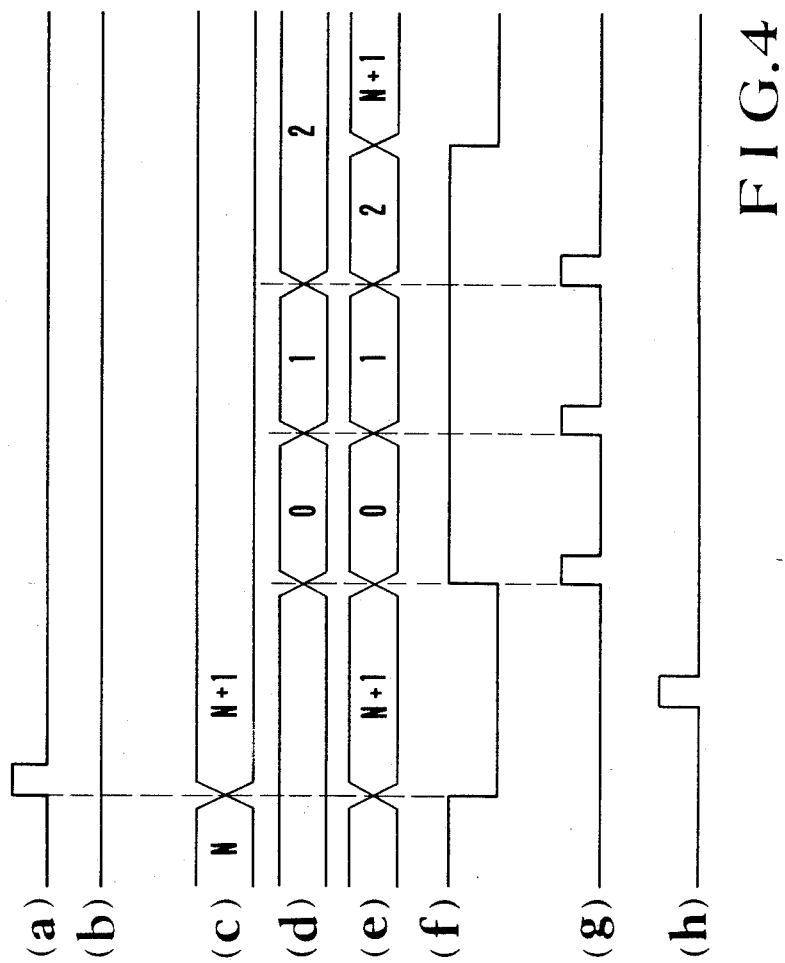
FIG. 4 is a time chart showing signals appearing in the radio system of the present invention.

FIG. 3 shows one example of the read signal generator 20 comprising a multiplexer 200, a timing control circuit 201, signal generator circuits 202 and 203 and an OR gate circuit 204. To explain the operation of this example, it is now assumed that three-byte data in the EPROM is read out by one channel switching processing. It is also assumed that the channel switch 1 produces a channel-up signal as shown at section (a) in FIG. 4 on one of its output signal lines and a channel-down signal remains unchanged as shown at section (b) in FIG. 4. When this channel-up signal from the channel switch 1 is supplied to the read signal generator 20, the signal generator circuit 202 produces a read signal corresponding to the signal supplied thereto as shown at (c) in FIG. 4 where N represents an N-th count. Since the channel-up signal from the channel switch 1 is also supplied to the timing control circuit 201 via an OR gate circuit 204, the timing control circuit 201 produces a control signal as shown at (f) in FIG. 4 which controls the multiplexer 200 to cause it to supply the signal shown at (c) generated by the signal generator 202 to EPROM 4 and the holding circuit 21 on the substrate 22. Subsequently, since the timing control circuit 201 produces a signal as shown at (g) of a predetermined period that controls the signal generator circuit 203, a predetermined signal as shown at (d) in FIG. 4 is generated from the signal generator circuit 203. In this signal shown at (d), a first byte (0), a second byte (1) and a third byte (2) are involved. At this time, since the signal shown at (f) is supplied to the multiplexer 200 from the timing control circuit 201, the multiplexer 200 sends out a signal as shown at (d) generated by the signal generator circuit 203 instead of the signal shown at (c) generated by the signal generator circuit 202. The latch write signal on line 100 is shown at (h) in FIG. 4.

As the signal from the channel switch 1 changes, the read signal generator 20 operates in the same manner to send out a read signal corresponding to a designated channel. The signal generator circuit 203 is so constructed as to produce different signals each time the state of the signal generated by the timing control circuit 201 changes. For example, the signal generator circuit 202 may be constituted by an up-down counter, and the signal generator circuit 203 by an address counter.

Since the number of the signal lines extending from the read signal generator 20 is reduced, the reliability and economy of the connector 8 can be improved even when the EPROM 4 is packaged on an independent substrate. For this reason, by preparing a plurality of types of substrates each packaged with EPROMs 4 written with necessary data, the controlling of frequency change can be facilitated.

Figure 5:
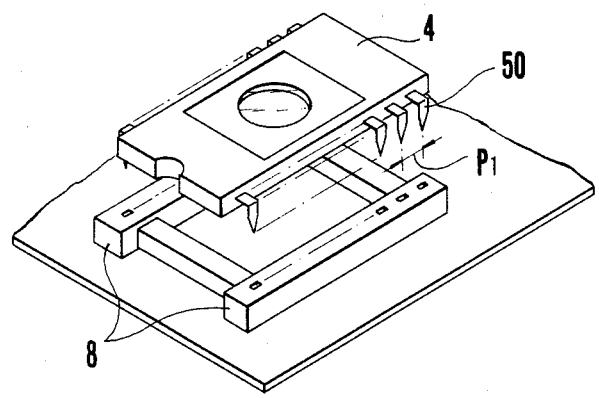
FIG. 5 is a fragmentary perspective view, partly exploded, showing a prior art EPROM package.
Figure 6:
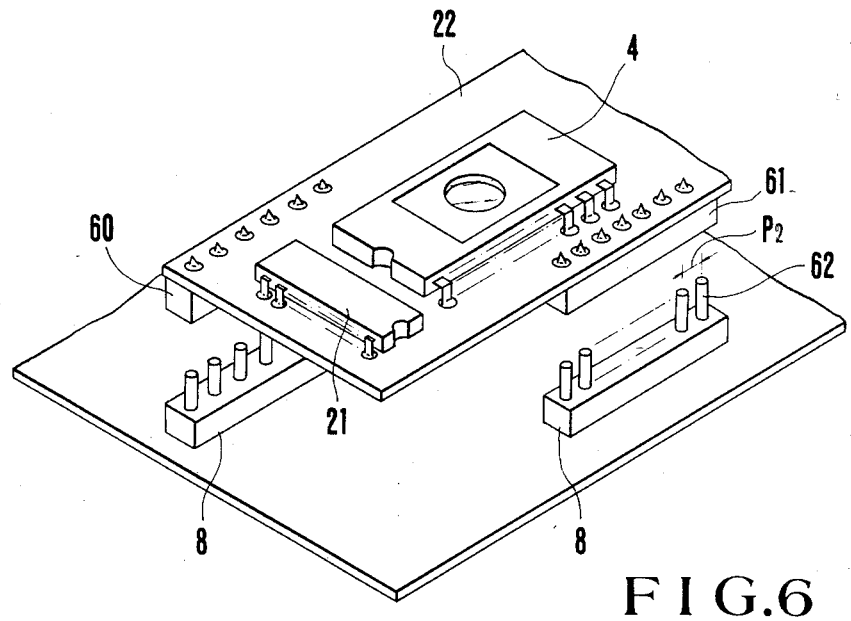
FIG. 6 is a fragmentary perspective view, partly exploded, showing an EPROM package according to the present invention.

Since it is necessary that the EPROM 4 be constructed in the form of a plug-in type for the purpose of effecting the controlling of frequency and hence an IC socket has hitherto been used, care should be taken when plugging an IC into the IC socket and only an artificer can complete the working by using a special tool. An IC socket for an EPROM 4 to be mated with connector 8 on a mother board is shown in FIG. 5. This IC socket has a number of plugs 50 arranged at a pitch P1 which is about 2.54 mm. Each plug has a thickness of about 0.2 mm and a width of about 0.5 mm and is difficult to handle. In contrast, in this invention, since the substrate is constructed as a plug-in type, its mounting and dismounting can be made very readily. The plug-in type substrate is exemplified in FIG. 6. The EPROM 4 and holding circuit 21 is packaged in common on the substrate 22. The substrate 22 having sockets 60 and 61 is mated with the connector 8 on a mother board. The connector 8 has prism-shaped plugs 62 of a crosssectional area of 0.7 mm², with these plugs arranged at a pitch P2 of 2.54 mm. The prism-shaped plug is robust and easy to handle.

As described above, in the radio system of this invention, the bits constituting a read signal are generated by a read signal generator in two parts, and the first or preceding part is held in the holding circuit, so that the number of the signal lines extending from the read signal generator can be reduced by half. Accordingly, even when the EPROM 4 is packaged on an independent substrate, the EPROM can be readily connected to a connector without imparing reliability. Moreover, the controlling of frequency can be facilitated.

What is claimed is:

1. In a radio system of the type comprising read signal generating means for generating a read signal comprising a plurality of bits, a memory circuit for storage of data, means for supplying said read signal to said memory circuit for reading out said data, and a synthesizer for producing a frequency determined by said read out data, the improvement wherein said read signal supplying neons comprises a holding circuit packaged on a substrate together with said memory circuit, said substrate being independent of other substances carrying other circuit elements, said holding circuit having an output coupled to said memory circuit and input terminal means, and wherein said read signal generating means includes means coupled to said input terminal means of said holding circuit for sending out said read signal in at least two successive multi-bit portions, a first portion being stored in said holding circuit and forming a first memory circuit address portion and a second portion by passing said holding circuit and thereby being coupled directly to said memory circuit and forming a second memory circuit address portion.

2. The radio system according to claim 1 wherein said read signal generating means comprises a first read signal generator circuit driven by a channel switch, a second read signal generator circuit driven by said channel switch through a timing control circuit and a multiplexer sequentially supplying outputs of said first and second read signal generator circuits to said holding circuit and said memory circuit under the control of said timing control circuit.

3. The radio system according to claim 1 further comprising a plug-in type connector connected between said substrate carrying said memory circuit and said holding circuit and said read signal generating means, and between said substrate and said synthesizer.

* * * * *